(12) United States Patent
Furuya

(10) Patent No.: US 7,745,240 B2
(45) Date of Patent: Jun. 29, 2010

(54) MANUFACTURING METHOD OF LIGHT-EMITTING ELEMENT WITH SURFACE LAYER REMOVAL

(75) Inventor: Akira Furuya, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 349 days.

(21) Appl. No.: 11/826,085

(22) Filed: Jul. 12, 2007

(65) Prior Publication Data
US 2008/0026497 A1 Jan. 31, 2008

(30) Foreign Application Priority Data
Jul. 14, 2006 (JP) .............................. 2006-193512

(51) Int. Cl.
*H01L 21/00* (2006.01)
(52) U.S. Cl. ........... 438/22; 257/E33.001; 257/E33.074
(58) Field of Classification Search .................... 438/22; 257/83, E33.001, E33.074
See application file for complete search history.

(56) References Cited
U.S. PATENT DOCUMENTS
2002/0197764 A1  12/2002  Uemura et al.
2006/0197094 A1  9/2006  Sugawara
2008/0121906 A1  5/2008  Yakushiji

FOREIGN PATENT DOCUMENTS

| JP | 2001-086460 A | 10/2001 |
|---|---|---|
| JP | 2001-274458 A | 10/2001 |
| JP | 2002-368263 A | 12/2002 |
| JP | 2004-165226 A | 6/2004 |
| JP | 2005-158971 A | 6/2005 |
| JP | 2006-86516 A | 3/2006 |
| JP | 2006-245380 A | 9/2006 |

OTHER PUBLICATIONS

Japanese Office Action (Notification of Reason (s) for Refusal) dated Feb. 19, 2008, issued in corresponding Japanese Patent Application No. 2006-193512.
Chinese Office Action dated Sep. 19, 2008, issued in corresponding Chinese Patent Application No. 200710136251.2.

*Primary Examiner*—W. David Coleman
*Assistant Examiner*—Sonya D McCall-Shepard
(74) *Attorney, Agent, or Firm*—Westerman, Hattori, Daniels & Adrian, LLP

(57) ABSTRACT

A manufacturing method of a light-emitting element includes emitting a laser light to a division region for separating a light-emitting element formed on a substrate, physically dividing the substrate along the division region, and removing a surface layer on at least one of the side faces of the substrate that is exposed by the dividing of the substrate.

5 Claims, 9 Drawing Sheets

MANUFACTURING METHOD OF LIGHT-EMITTING ELEMENT WITH SURFACE LAYER REMOVAL

BACKGROUND OF THE INVENTION

1. Field of the Invention

This invention generally relates to a manufacturing method of a light-emitting element, and in particular, relates to a manufacturing method of a light-emitting element including a process of removing a surface layer of a side face of the light-emitting element.

2. Description of the Related Art

A light-emitting element is a device emitting a light such as a LED (Light Emitting Diode) or a LD (Laser Diode). The light-emitting element is used in a light source for a display or in an illumination, in addition to an optical communication system and a memory device using an optical memory media. There is a demand for a light-emitting element that has high photoelectric conversion efficiency and is inexpensive.

Recently, there has been developed a light-emitting element in which a GaN (gallium nitride)-based light-emitting layer is formed on a hard substrate composed of such as sapphire or SiC (silicon carbide). There is a demand for cutting the hard substrate into a small chip-sized device productively in order to reduce a cost of manufacturing a light-emitting element. In a case of a GaN-based LED having a sapphire substrate, the chip size is 300 μm and the sapphire substrate is hard. Therefore, mass productivity is low with respect to a dicing method or scribe and break method using a diamond scriber that is ordinarily used as a separating method of light-emitting element. There is a method of dividing a sapphire substrate by irradiating a laser to the sapphire substrate.

Japanese Patent Application Publication No. 2004-165226 (hereinafter referred to as Document 1) discloses a method in which devices are divided into chips after a laser light is irradiated to a division region of the sapphire substrate and a melted and re-solidified region or an evaporating and re-solidified region in a recess formed on the sapphire substrate is subjected to a blast treatment.

FIG. 1A through FIG. 1C illustrate a problem of a conventional art. As shown in FIG. 1A, an n-type GaN cladding layer 12, a GaInN quantum well active layer 14 and a p-type GaN cladding layer 16 are formed on a sapphire substrate 10 as a light-emitting portion 30. An electrode 18 is formed on the n-type cladding layer 12. An electrode 19 is formed on the p-type cladding layer 16. A laser light is irradiated from a face of the sapphire substrate 10 opposite to the light-emitting portion 30 to a division region for separating a light-emitting element. As shown in FIG. 1B, a recess 20 is formed on the division region of the sapphire substrate 10 being irradiated with the laser light, because the sapphire evaporates.

As shown in FIG. 1C, the sapphire substrate 10 is divided along the recess 20, and a light-emitting element (LED) 32 is formed. The light-emitting element 32 emits a light in four directions from the light-emitting portion 30. The face of the sapphire substrate 10 opposite to the light-emitting portion 30 is referred to as a light-emitting face S1.

The inventor searched an emitted light quantity from a light-emitting element that is separated with the method shown in FIG. 1A through FIG. 1C and from a light-emitting element that is separated with a scribe and break method. The scribe and break method is a method in which breaking is performed after scribing without a laser irradiation. As a result, it is confirmed that the emitted light quantity from the light-emitting element separated with the method shown FIG. 1A through FIG. 1C is lower than that from the light-emitting element separated with the scribe and break method by approximately 10%.

A region, of which temperature is increased with the laser irradiation without evaporation, is altered in the division region to which the laser is irradiated, and an altered layer 22 is formed, according to an examination of the inventor. It is confirmed that the emitted light quantity is reduced because of a light absorption of the altered layer 22. And, it is confirmed that the altered layer 22 extends deeply in the sapphire substrate 10 as shown in FIG. 2 along the laser light even if the recess 20 is not deep, as shown in FIG. 1B. It is therefore not possible to remove the altered layer 22 extending deeply in the sapphire substrate 10 even if the method of Document 1 is used. And it is not possible to sufficiently restrain the reduction of the emitted light quantity caused by the altered layer 22, even if the method of Document 1 is used.

SUMMARY OF THE INVENTION

The present invention provides a manufacturing method of a light-emitting element that may restrain a reduction of an emitted light quantity caused by an altered layer formed with a laser light irradiation.

According to an aspect of the present invention, preferably, there is provided a manufacturing method of a light-emitting element including irradiating a laser light to a division region for separating a light-emitting element formed on a substrate, physically dividing the substrate along the division region, and removing a surface layer on at least one of the side faces of the substrate that is exposed by the dividing of the substrate.

With the above-mentioned method, it is possible to remove an altered layer that is formed deeply in the substrate without evaporation because of a laser light. And it is possible to increase a light extraction efficiency of the light-emitting element.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 3A:
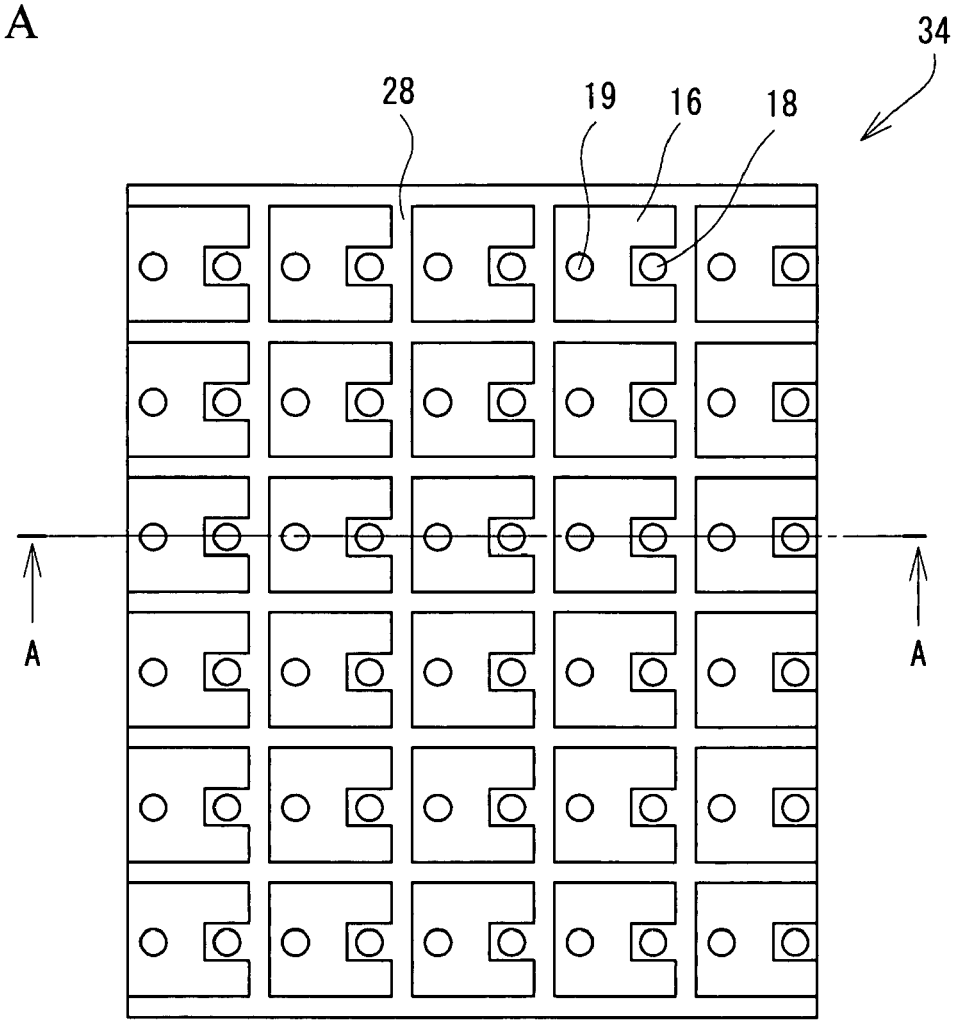
FIG. 3A illustrates a top view of a wafer having a light-emitting element thereon.
Figure 3B:
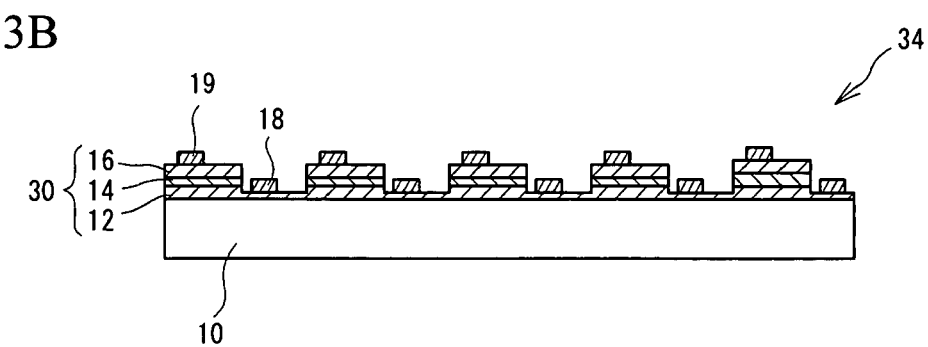
FIG. 3B illustrates a cross sectional view taken along a line A-A of FIG. 3A.

A first embodiment is a case where an altered layer is removed with a sandblast method. FIG. 3A illustrates a top view of a wafer on which a light-emitting element is formed. FIG. 3B illustrates a cross sectional view taken along a line A-A of FIG. 3A. An undoped GaN buffer layer (not shown), an n-type GaN cladding layer 12, an active layer 14 and a p-type GaN cladding layer 16 are grown on the sapphire substrate 10 in order with a MOCVD method. The sapphire substrate 10 has a thickness of approximately 300 μm. The undoped GaN buffer layer has a thickness of 1 μm. The n-type GaN cladding layer 12 has a thickness of 3 μm. The active layer 14 includes GaInN as a quantum well layer. The p-type cladding layer 16 and the active layer 14 are subjected to an etching treatment with use of chlorine-based gas. The p-type cladding layer 16 is formed into matrix islands. A lattice-shaped region 28 subjected to the etching treatment is to be a division region for dividing elements into chips. An ohmic metal electrode 18 is formed on the n-type cladding layer 12. An ohmic metal electrode 19 is formed on the p-type cladding layer 16. This results in that the light-emitting portion 30 is formed on the sapphire substrate 10. And a wafer process is completed.

A wafer 34 is adhered to a ceramics substrate with use of a wax so that the sapphire substrate 10 side of the wafer 34 is a front surface and the light-emitting portion 30 side of the wafer 34 is a back face. The sapphire substrate 10 is subjected to a grinding or polishing process so that the thickness of the sapphire substrate 10 is reduced to 50 to 150 μm. After that, the wax is melted and the wafer 34 is detached from the ceramics substrate. The wafer 34 is washed, and is adhered to an adhesive extensible sheet 40 so that the substrate side of the wafer 34 is the front face and the light-emitting portion 30 side of the wafer 34 is the back face (shown in FIG. 4A). In FIG. 4A through FIG. 4E, a detail structure in the light-emitting portion 30 is omitted.

Figure 4A:
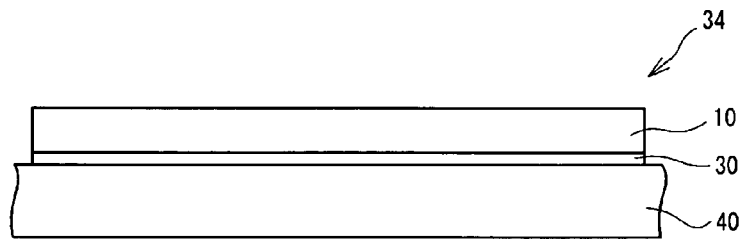
FIG. 4A through FIG. 4E illustrate a manufacturing process of a light-emitting element in accordance with a first embodiment.
Figure 4B:
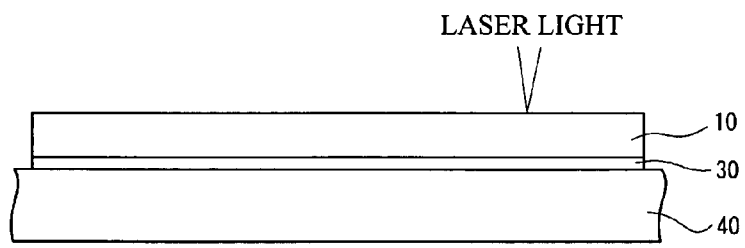

As shown in FIG. 4B, a laser light having a wavelength of 355 nm is irradiated to a region corresponding to the region 28 shown in FIG. 3A, the division region for separating a light-emitting element. For example, the laser light is irradiated so as to focus approximately at the surface of the sapphire substrate 10 in a condition where a beam diameter of the laser light is 7 μm, an average output of the laser light is 800 mW, a pulse period of the laser light is 40 kHz, and a feed rate of the laser light is 20 mm/s.

Figure 1A:
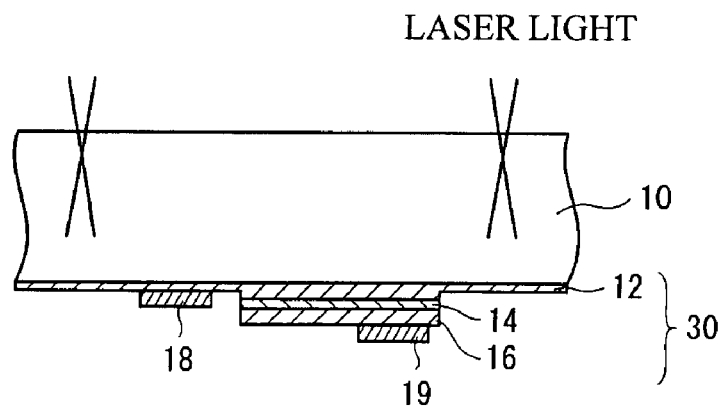
FIG. 1A through FIG. 1C illustrate a cross sectional view of a manufacturing process of a light-emitting element showing a problem of a conventional art.
Figure 1B:
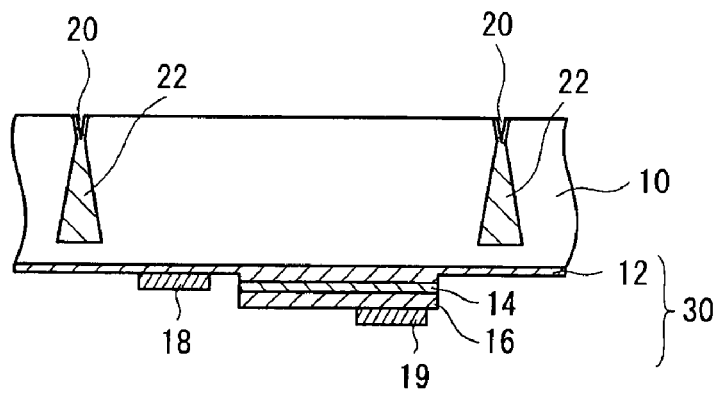
Figure 1C:
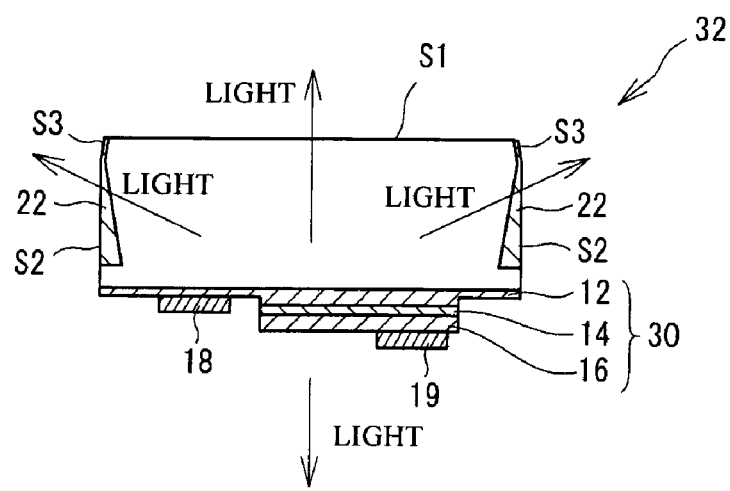
Figure 2:
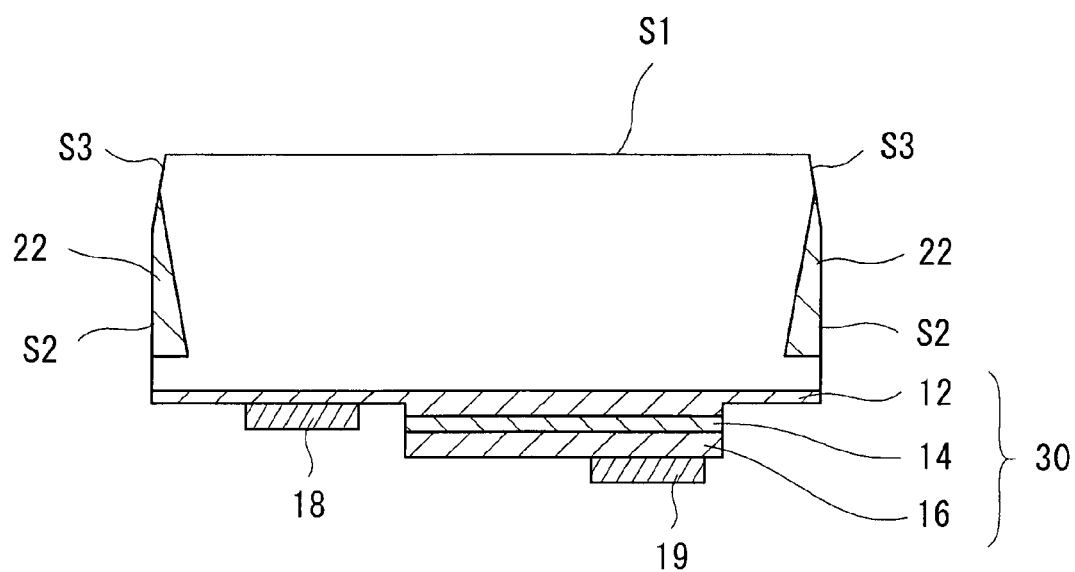
FIG. 2 illustrates a cross sectional view of a light-emitting element showing a problem of an art in accordance with Document 1.
Figure 4C:
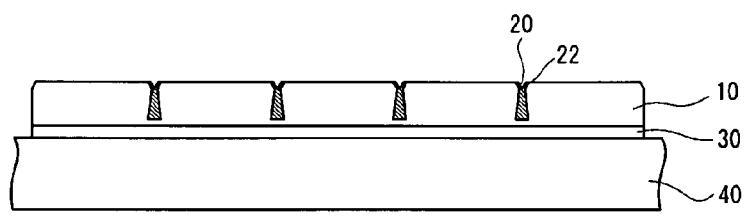
Figure 4D:
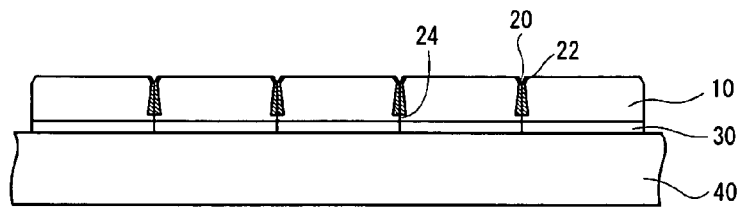
Figure 4E:
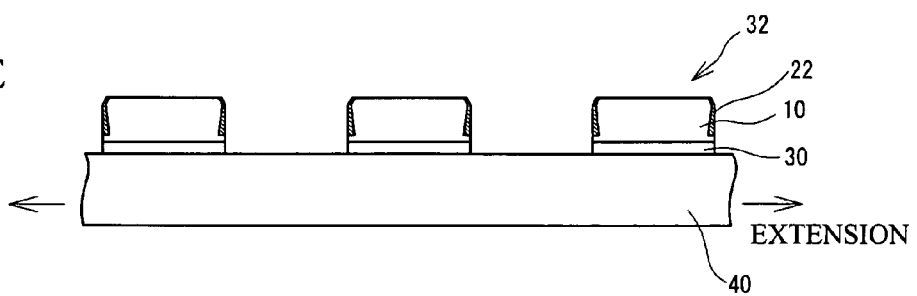

As shown in FIG. 4C, the recess 20 and the altered layer 22 are formed at the surface of the sapphire substrate 10, similarly to FIG. 1B. As shown in FIG. 4D, a metal blade is pressed to the sapphire substrate 10 along the recess 20. This results in that a crack 24 is formed from the recess 20 in the sapphire substrate 10, and the sapphire substrate 10 is physically divided along the division region. As shown in FIG. 4E, each light-emitting element 32 may be separated at substantially even interval, when the extensible sheet 40 is extended.

Figure 5A:
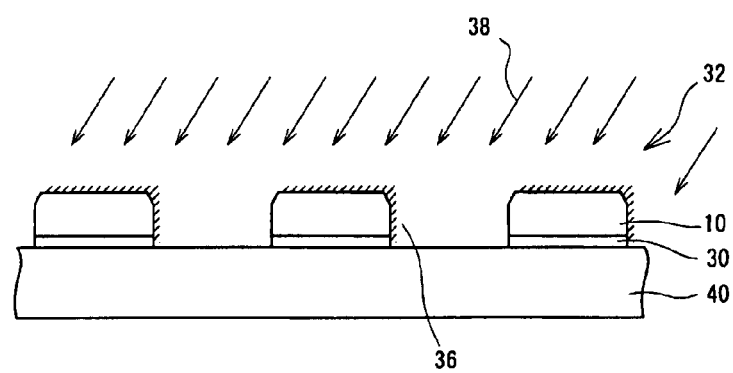
FIG. 5A through FIG. 5C illustrate a manufacturing process of a light-emitting element in accordance with a first embodiment.
Figure 5B:
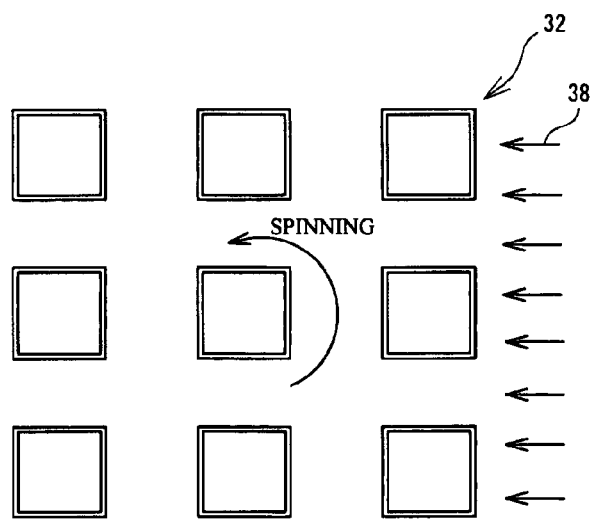

As shown in FIG. 5A, the light-emitting element 32 is subjected to a blast treatment from an oblique direction with use of a boron carbide grinding compound 38. This results in a removal of a surface layer 36 including the altered layer 22 on the side face of the light-emitting element 32. In the blast treatment, a region where the grinding compound 38 hits is removed. It is therefore preferable that the grinding compound 38 is injected to the extensible sheet 40 from a possibly horizontal direction, in order to remove the altered layer 22 on the side face of the light-emitting element 32. It is therefore preferable that an interval between each light-emitting element 32 is more than half of the width of the light-emitting element 32, more preferably, more than the width of the light-emitting element 32. Further, it is preferable that the blast treatment is performed with the extensible sheet 40 spinning as shown in FIG. 5B, in order to remove the altered layer 22 on the four side faces of the light-emitting element 32.

Figure 5C:
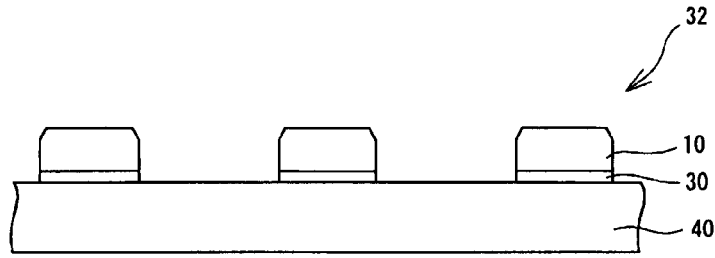
Figure 6A:
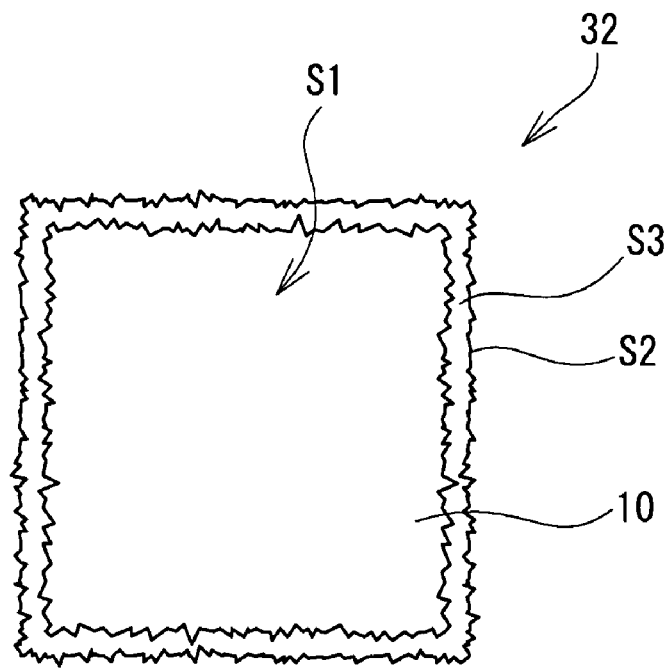
FIG. 6A and FIG. 6B illustrate a top view and a cross sectional view of a light-emitting element in accordance with a first embodiment respectively.
Figure 6B:
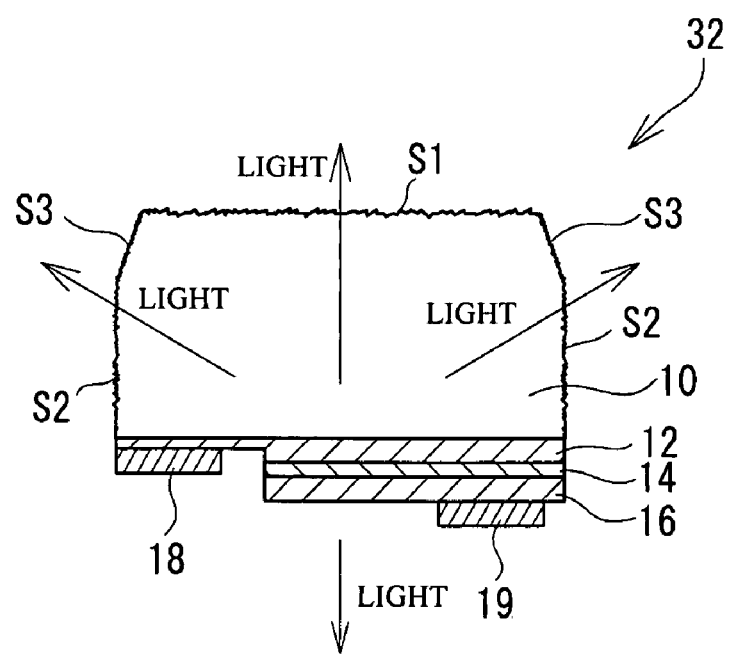

As shown in FIG. 5C, the altered layer 22 is removed with the blast treatment. FIG. 6A illustrates the light-emitting element 32 viewing from the sapphire substrate 10 side. FIG. 6B illustrates a cross sectional view. A light of the light-emitting portion 30 is mainly emitted from a light-emitting face S1, a side face S2 and a side face S3. The light-emitting face S1 and the side faces S2 and S3 respectively have a face subjected to the blast treatment. The face subjected to the blast treatment is roughed, similarly to a ground glass. That is, the face subjected to the blast treatment is rougher than a face not subjected to the blast treatment. In a case where a part of the surface of the sapphire substrate 10 of 10 μm is removed in a condition where an injection pressure and an injection distance of the grinding compound 38 shown in FIG. 5A and FIG. 5B are 0.25 MPa and 60 mm respectively, an average surface roughness and the maximum height of the surface of the sapphire substrate 10 are approximately 0.3 μm and approximately 3.5 μm respectively when the average particle diameter of the grinding compound 38 is approximately 7 μm. And, the average surface roughness and the maximum height of the sapphire substrate 10 are approximately 0.5 μm and approximately 4.0 μm respectively when the average particle diameter of the grinding compound 38 is approximately 15 μm. When the blast treatment is performed so that the grinding depth of the four side faces S2 and the four side faces S3 is 10 μm, the photoelectric conversion efficiency is increased by 12% (in a case where the average particle diameter is 7 μm) and is increased by 14% (in a case where the average particle diameter is 15 μm) compared to a light-emitting element not subjected to the blast treatment.

In accordance with the first embodiment, it is possible to increase the photoelectric conversion efficiency of the light-emitting element 32 by removing the altered layer 22 formed on the side faces S2 and S3 of the sapphire substrate 10. It is possible to obtain the advantage if the side face S2 and the side face S3 of the altered layer 22 on at least one of the four side faces of the sapphire substrate 10 are subjected to the blast treatment. It is preferable that whole of one of the side faces S2 and whole of one of the side faces S3 is subjected to the blast treatment. And, it is more preferable that the altered layer 22 on the four side faces S2 and the four side faces S3 of the sapphire substrate 10 are removed. And, it is possible to perform the blast treatment with the light-emitting element 32 being adhered to the extensible sheet 40 in a case where the altered layer 22 is removed with the blast treatment, compared to an third embodiment where the altered layer 22 is removed with a dry etching treatment. It is therefore possible to separate the light-emitting element 32 with the other light-emitting elements 32 being aligned. And it is possible to remove the altered layer 22 speedily with the blast treatment.

In addition to the advantage of the removal of the altered layer 22 on the side face S2, the advantage of improvement of light extraction from the element is added because of light scattering at the roughed surface, because the face subjected to the blast treatment is roughed similarly to a ground glass. Therefore, the light extraction is improved synergistically. In the first embodiment, the light-emitting face S1 in addition to the side face S2 are subjected to the blast treatment, and the faces are roughed. The more, the light extraction is improved. And the photoelectric conversion efficiency of whole of the light-emitting element is improved.

Second Embodiment

Figure 7A:
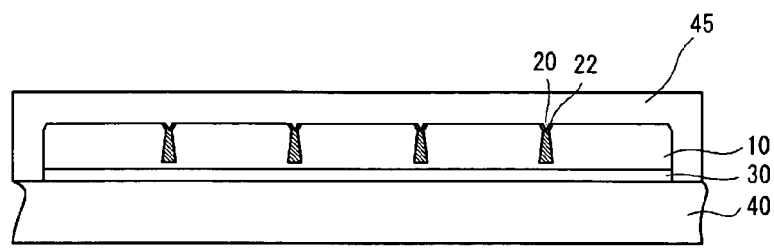
FIG. 7A through FIG. 7E illustrate a manufacturing process of a light-emitting element in accordance with a second embodiment.
Figure 7B:
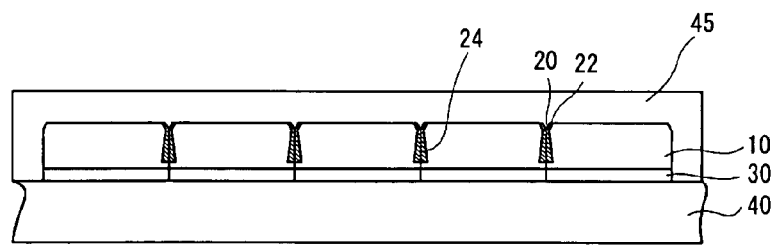
Figure 7C:
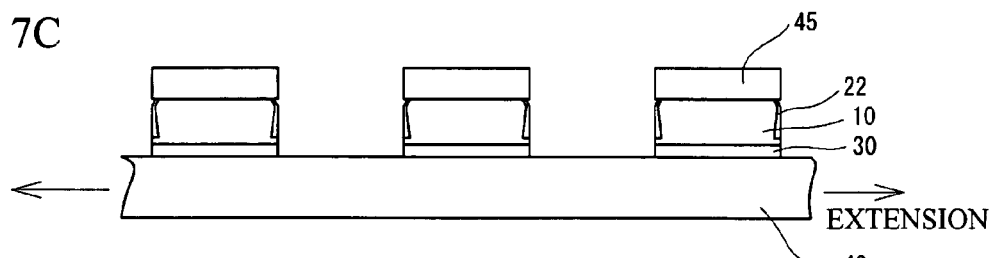
Figure 7D:
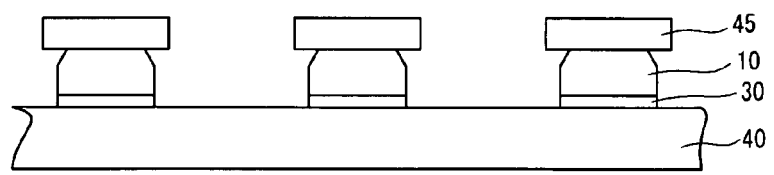
Figure 7E:
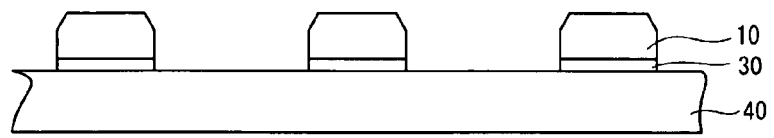

A second embodiment is a case where the light-emitting face S1 of the sapphire substrate 10 is not subjected to the blast treatment. As shown in FIG. 7A, polyvinyl alcohol is coated so as to cover the wafer and a protective layer 45 composed of the polyvinyl alcohol is formed, after the process of FIG. 4A in the first embodiment. A laser light is irradiated to the sapphire substrate 10 through the protective layer 45 and the recess 20 is formed. In this case, the altered layer 22 is also formed. As shown in FIG. 7B, the sapphire substrate 10 is divided physically similarly to the process of FIG. 4D. As shown in FIG. 7C, the extensible sheet 40 is extended similarly to the process of FIG. 4E. As shown in FIG. 7D, the blast treatment is performed similarly to the process of FIG. 5A. In this case, the light-emitting face S1 is not subjected to the blast treatment because the protective layer 45 covers the light emitting-face of the sapphire substrate 10. As shown in FIG. 7E, the protective layer 45 is removed with a water washing. It is preferable that the extensible sheet is not degraded in the process of removing the protective layer 45. It is therefore preferable that the protective layer 45 is removed with a chemical such as water not degrading the extensible sheet.

Figure 8A:
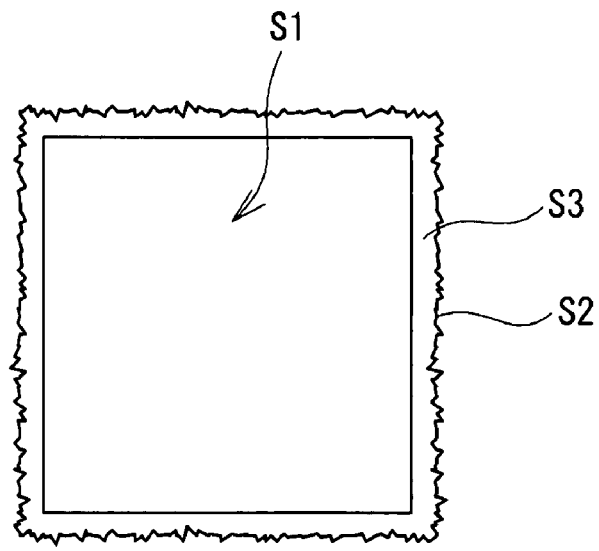
FIG. 8A and FIG. 8B illustrate a top view and a cross sectional view of a light-emitting element in accordance with a second embodiment respectively.
Figure 8B:
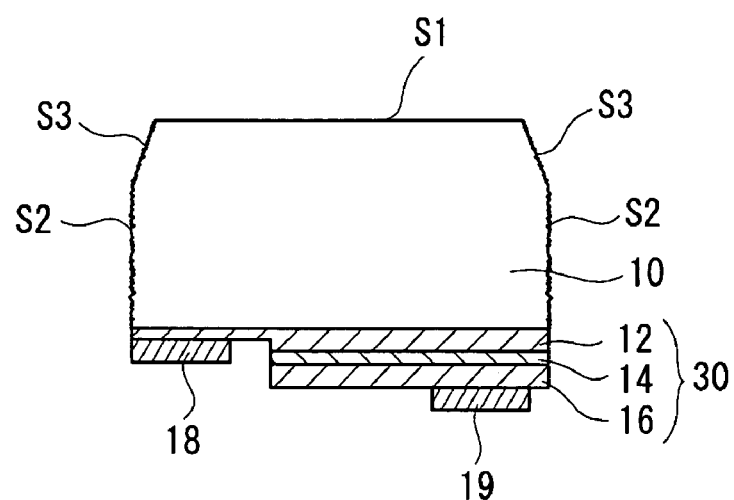

FIG. 8A and FIG. 8B illustrate a top view and a cross sectional view respectively of the light-emitting element manufactured with the method in accordance with the second embodiment. The light-emitting face S1 is not subjected to the blast treatment, being different from the processes of FIG. 6A and FIG. 6B in the first embodiment. In accordance with the second embodiment, the light-emitting face S1 is not subjected to the blast treatment, only the side faces S2 and S3 are subjected to the blast treatment, and recovery of property is promoted because of the removal of the altered layer 22 on the side face S2 and the side face S3 and roughing the faces. It is therefore effective to use the second embodiment for mounting with use of transparency of a chip, if it is preferable that the light-emitting face S1 is not subjected to the blast treatment.

Third Embodiment

Figure 9:
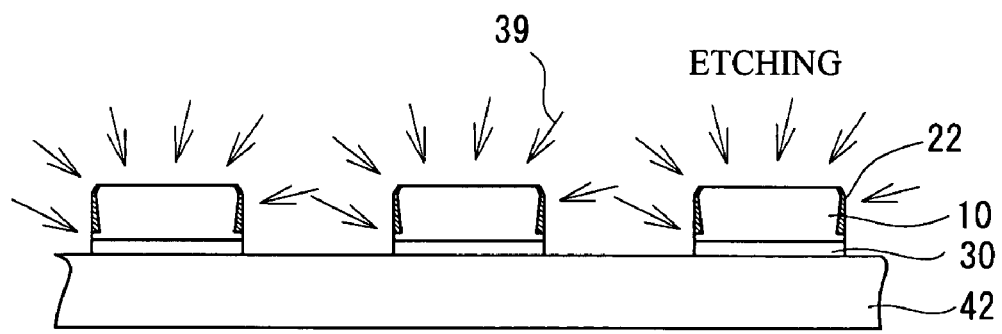
FIG. 9 illustrates a manufacturing process of a light-emitting element in accordance with a third embodiment.

A third embodiment is a case where the altered layer 22 is removed with an etching treatment. As shown in FIG. 9, each light-emitting element 32 is arranged on a sapphire substrate 42 after the process of FIG. 4E in the first embodiment. The sapphire substrate 42 is arranged in an etching device having a parallel plate shape. The surface (the light emitting face) and the side face of the sapphire substrate 10 are subjected to an etching treatment with argon plasma 39. This results in the removal of the altered layer 22. The photoelectric conversion efficiency is increased by approximately 2% compared to the light-emitting element not subjected to the etching treatment, when the etching treatment is performed to the surface and the side face of the sapphire substrate 10 to approximately 1 μm depth in the third embodiment. The etching may be a wet etching other than the dry etching.

In the first embodiment through the third embodiment, the side faces S2 and S3 are removed with the blast method and the etching method. Another method may be used if the side faces S2 and S3 are removed and the altered layer is removed. The sapphire substrate is used as a substrate of the light-emitting element 32 in the above-mentioned embodiments. However, another substrate composed of a material transmitting the emitted light from the light-emitting portion 30 may be applied to the above-mentioned embodiments. As is shown in FIG. 6A and FIG. 8A, the light-emitting face S1 of the sapphire substrate 10 has four sides, four side faces S2 and four side faces S3. The light-emitting face S1 may have a circle shape or another polygonal shape. In this case, the number of the side faces S2 and S3 are optional.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-193512 filed on Jul. 14, 2006, the entire disclosure of which is hereby incorporated by reference.

What is claimed is:

1. A manufacturing method of a light-emitting element comprising:
   irradiating a laser light to a division region for separating light-emitting elements formed on a substrate;
   physically dividing the substrate along the division region after the step of irradiating a laser light;
   expanding an extensible sheet on which the light-emitting elements are adhered so that an interval between each of the light-emitting elements is more than half of a width of the light-emitting elements, after a step of physically dividing the substrate; and
   removing an altered layer, that is formed during irradiating the laser light, on at least one of the side faces of the substrate that is exposed by the dividing of the substrate with a blast method, after a step of expanding the extensible sheet.

2. The method as claimed in claim 1, wherein the substrate is a sapphire substrate.

3. The method as claimed in claim 1, wherein the altered layer on all exposed side faces of the substrate are removed in the step of removing the altered layer.

4. The method as claimed in claim 1, wherein the altered layer is removed with an etching method in the step of removing the altered layer.

5. The method as claimed in claim 1 further comprising forming a protective layer on a face of the substrate to which the laser light is irradiated, before the step of dividing the substrate.

* * * * *